(12) United States Patent
Kim

(10) Patent No.: US 7,253,039 B2
(45) Date of Patent: Aug. 7, 2007

(54) METHOD OF MANUFACTURING CMOS TRANSISTOR BY USING SOI SUBSTRATE

(75) Inventor: Hak-Dong Kim, Suwon (KR)

(73) Assignee: Dongbu Elecotronics Co., Ltd., Seoul (KR)

( * ) Notice: Subject to any disclaimer, the term of this patent is extended or adjusted under 35 U.S.C. 154(b) by 406 days.

(21) Appl. No.: 11/020,238

(22) Filed: Dec. 27, 2004

(65) Prior Publication Data

US 2005/0142730 A1    Jun. 30, 2005

(30) Foreign Application Priority Data

Dec. 27, 2003   (KR) ..................... 10-2003-0098382

(51) Int. Cl.
   *H01L 21/84*   (2006.01)
(52) U.S. Cl. ............... 438/154; 438/300; 257/E21.634
(58) Field of Classification Search ............... 438/153, 438/154, 222, 226, 300; 257/E21.634
   See application file for complete search history.

(56) References Cited

U.S. PATENT DOCUMENTS

| | | | |
|---|---|---|---|
| 5,731,217 A * | 3/1998 | Kadosh et al. | ............... 438/300 |
| 5,818,069 A * | 10/1998 | Kadosh et al. | ................ 257/67 |
| 6,235,567 B1 * | 5/2001 | Huang | ........................ 438/202 |

* cited by examiner

*Primary Examiner*—Chandra Chaudhari
(74) *Attorney, Agent, or Firm*—Lowe Hauptman & Berner LLP

(57) ABSTRACT

In a method of manufacturing a CMOS transistor, an n-channel MOS transistor is formed on an upper MOS transistor in a first region of an SOI substrate having first and second regions. Next, an insulating layer of the SOI substrate is exposed by removing an upper silicon layer in a second region, and then, a first insulating layer is formed to cover the first and second regions. Next, a silicon epitaxial layer is formed on the first insulating layer of the second region, and then, a p-channel MOS transistor is formed on the silicon epitaxial layer. An n-channel MOS transistor is formed on the upper silicon layer of the SOI substrate and a p-channel MOS transistor on the first insulating layer has a vertical step (relative to the n-channel MOS transistor), so that it is possible to increase integration degree.

8 Claims, 6 Drawing Sheets

METHOD OF MANUFACTURING CMOS TRANSISTOR BY USING SOI SUBSTRATE

BACKGROUND OF THE INVENTION

1. Field of the Invention

The present invention relates to a method of manufacturing a MOS transistor, and more particularly, to a method of manufacturing a CMOS transistor by using a SOI (silicon on insulator) substrate to increase integration degree.

2. Description of the Related Art

FIGS. 1 to 5 are cross sectional views for explaining a method of manufacturing a conventional MOS transistor, such as a p-channel MOS transistor.

Referring to FIG. 1, an active region where a MOS transistor is to be formed is defined by forming an element isolation layer 110 on an n-type semiconductor substrate 100. Alternatively, instead of the n-type semiconductor substrate 100, a p-type semiconductor substrate may be used. In this case, an n-type well region is formed on the p-type semiconductor substrate.

Next, a gate stack is formed by subsequently stacking a gate insulating layer pattern 120 and a gate conductive layer pattern 130 on the active region of the substrate 100. The gate stack is disposed to cover a channel region in an upper portion of the semiconductor substrate 100.

Referring to FIG. 2, in order to reduce a short channel effect, a halo ion implanting process is performed. As a result, a halo impurity region 141 is formed to surround a channel region under the gate insulating layer pattern 120 by implanting n-type impurity ions in the substrate 100 in a slanted direction thereof.

Referring to FIG. 3, a first ion implanting process is performed by implanting p-type impurity ions in the substrate 100. As a result, source/drain extension regions 142 are formed in the substrate at both sides of the gate 130. In some cases, the first ion implanting process may be performed prior to the halo ion implanting process.

In addition, although not shown in the figure, an oxide layer may be formed as an ion implanting buffer layer on a surface of the substrate 100 prior to the second ion implanting process.

Referring to FIG. 4, gate spacer layers 150 are formed on side walls of the gate conductive layer 130. Next, a second ion implanting process is performed by implanting p-type impurity ions by using the gate spacer layers 150 as an ion implanting barrier. As a result, source/drain regions 143 are formed in the substrate 100 at the respective sides of the gate spacer layers 150.

Referring to FIG. 5, a MOS transistor is completed by performing a general silicide process forming metal silicide layers 160 on the source/drain regions 143 and the gate conductive layer pattern 130 and subsequently performing a general metallization process.

The aforementioned method of manufacturing the MOS transistor may be adapted to an n-channel MOS transistor as well as the aforementioned p-channel MOS transistor.

However, as recognized by the present inventor, in a CMOS transistor where p-type and n-channel MOS transistors are formed parallel to each other in the same layer in a single substrate, since an element isolation layer needs to be formed to isolate the p-type and n-channel MOS transistors, there is a limitation to increase integration degree.

SUMMARY OF THE INVENTION

In order to solve the aforementioned problems, an object of the present invention is to provide a method of manufacturing a CMOS transistor capable of increasing integration degree by using a SOI substrate.

According to one aspect of the present invention, there is provided a method of manufacturing a CMOS transistor, including steps of: preparing a SOI substrate having an insulating layer between lower and upper silicon layers, a first region where an n-channel MOS transistor is to be disposed, and a second region where a p-channel MOS transistor is to be disposed; subsequently forming a first gate insulating layer pattern and a first gate conductive layer pattern on the upper silicon layer of the first region in the SOI substrate; forming a first source/drain region on the upper silicon layer of the first region by performing a first ion implanting process; removing the upper silicon layer of the second region by using a mask film pattern for covering the first region as an etching mask; forming a first insulating layer on the upper silicon layer and the first gate conductive layer pattern of the first region and the insulating layer exposed in the second region; forming a second insulating layer on the first insulating layer; exposing a portion of a surface of the first insulating layer in the second region by removing a portion of the second insulating layer; forming a silicon epitaxial layer on the exposed surface of the first insulating layer and removing the second insulating layer; forming a second gate insulating layer pattern and a second gate conductive layer pattern on the silicon epitaxial layer; and forming second source/drain regions on the silicon epitaxial layer by performing a second ion implanting process.

In the above aspect, the first insulating layer may be a low temperature oxide layer having a thickness of 1000 to 5000 Å. In addition, a top surface of the low temperature layer may be planarized by performing a planarization process.

In addition, the silicon epitaxial layer may have a thickness of 1000 to 5000 Å.

In addition, the second insulating layer may be a low temperature oxide layer having a thickness of 1000 to 5000 Å.

In addition, the first ion implanting process may be performed by implanting arsenic (As) ions with an implanting energy of about 5 to 50 keV and a concentration of about $5 \times 10^{14}$ to $1 \times 10^{15}$ ions/cm$^2$.

In addition, the second ion implanting process may be performed by implanting boron (B) ions with an implanting energy of about 2 to 50 keV and a concentration of about $5 \times 10^{14}$ to $5 \times 10^{15}$ ions/cm$^2$.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Now, exemplary embodiments of the present invention will be described with reference to the attached drawings. However, the present invention can be embodied in various modifications and thus is not limited to the embodiments described below.

FIGS. 6 to 11 are cross sectional views for explaining a CMOS transistor according to embodiments of the present invention.

Figure 1:
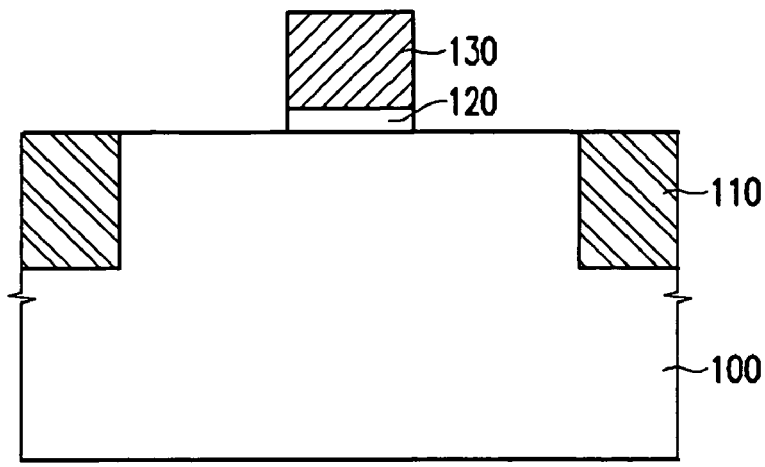
FIGS. 1 to 5 are cross sectional views for explaining a conventional MOS transistor.
Figure 2:
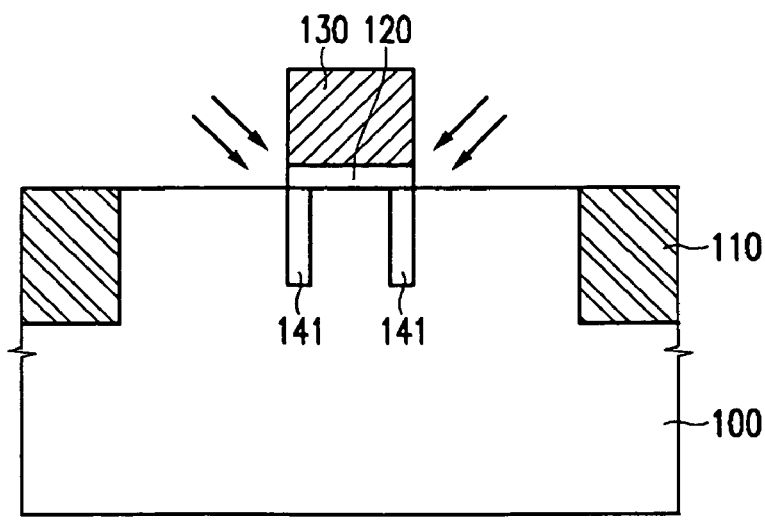
Figure 3:
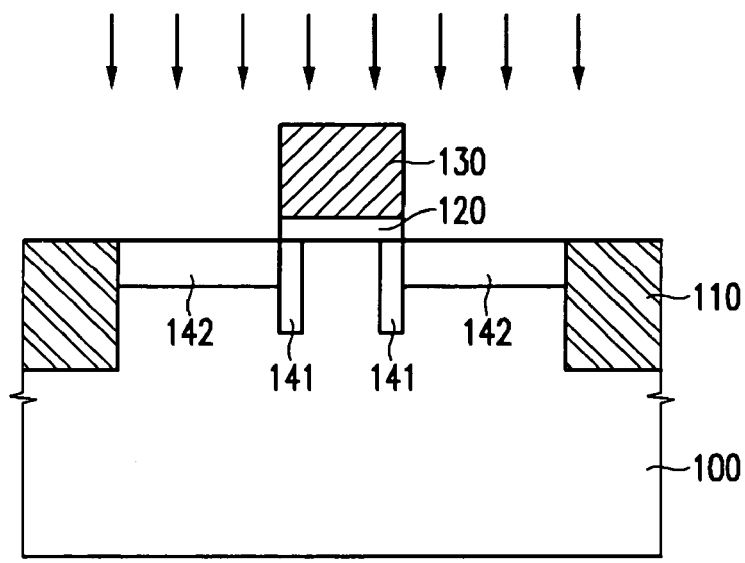
Figure 4:
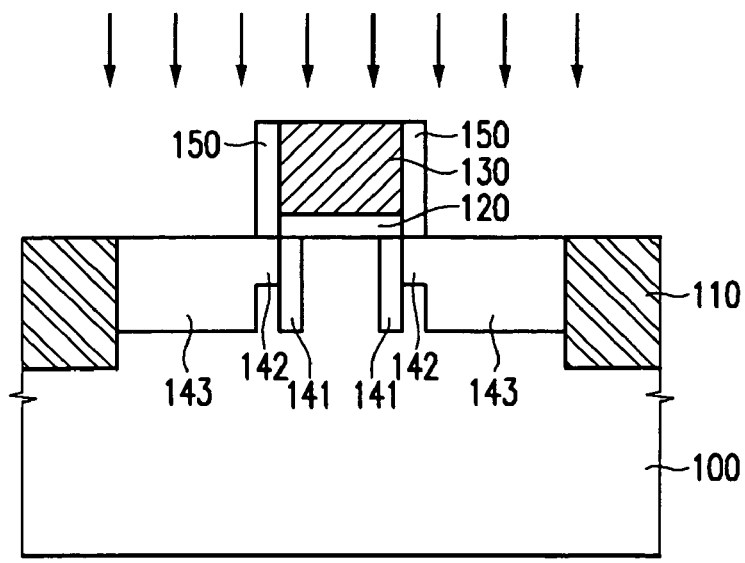
Figure 5:
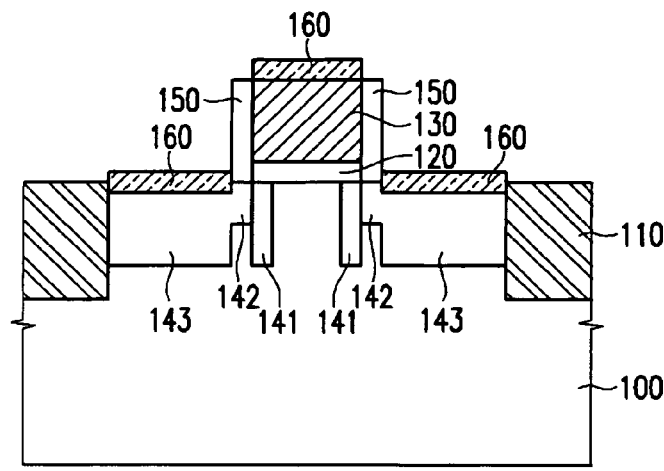
Figure 6:
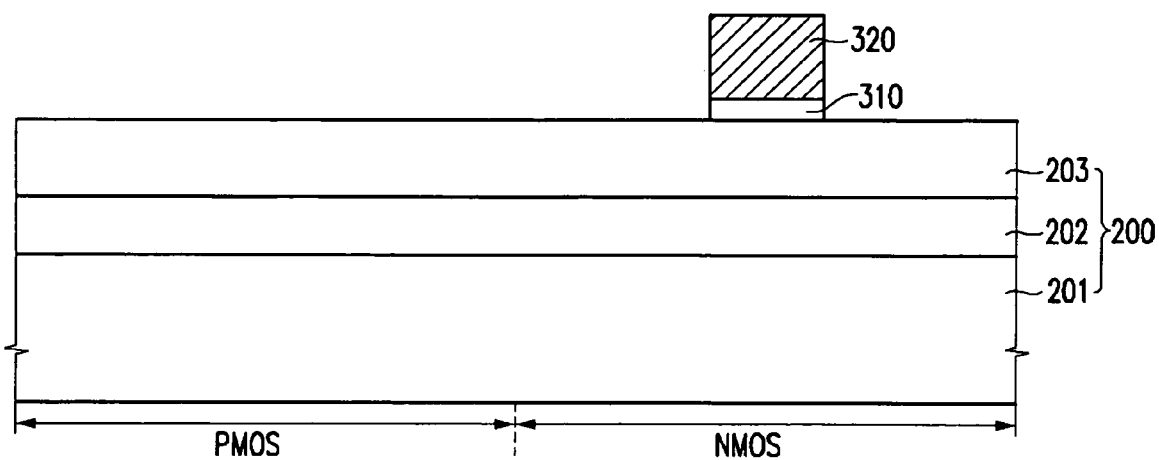
FIGS. 6 to 11 are cross sectional views for explaining a CMOS transistor according to embodiments of the present invention.

Referring to FIG. 6, a SOI (silicon on insulator) substrate 200 having an insulating layer 202 between lower and upper silicon layers 201 and 203 is prepared. The insulating layer 203 is typically a buried oxide layer.

The SOI substrate 200 includes a first region NMOS where an n-channel MOS transistor is to be disposed and a second region PMOS where a p-channel MOS transistor is to be disposed.

Next, a first gate insulating layer pattern 310 and a first gate conductive layer pattern 320 is subsequently formed on the upper silicon layer 203 of the first region NMOS in the SOI substrate 200. The first gate insulating layer pattern 310 is an oxide layer having a thickness of about 10 to 50 Å; and the first gate conductive layer pattern 320 is a polysilicon layer having a thickness of about 500 to 2000 Å.

Figure 7:
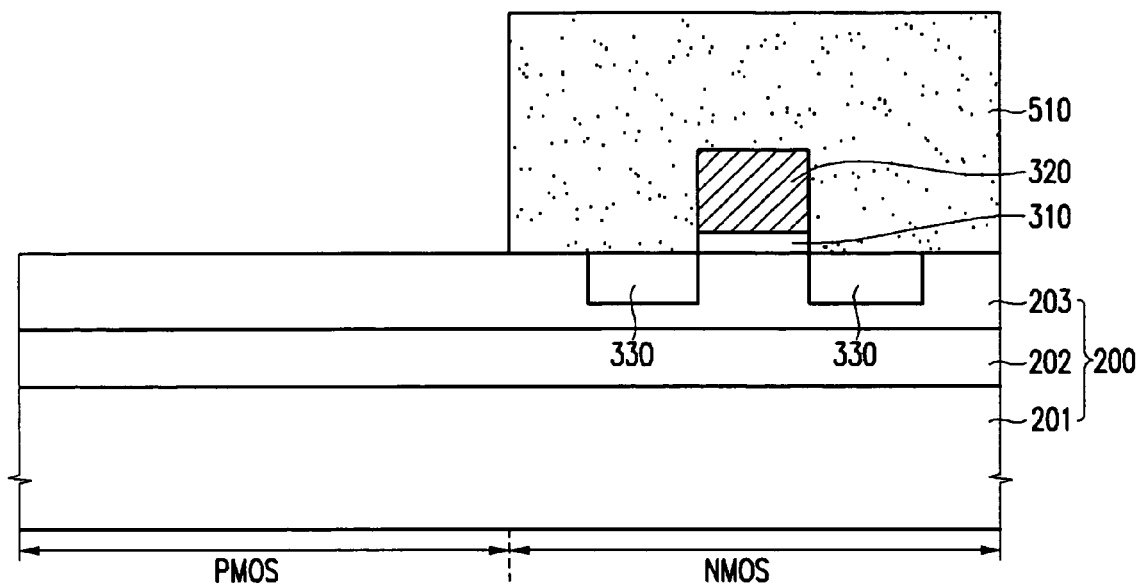

Referring to FIG. 7, a first source/drain region 330 is formed on the upper silicon layer 203 of the first region NMOS by performing a first ion implanting process. Here, the first ion implanting process is performed by implanting arsenic (As) ions with an implanting energy of about 5 to 50 keV and a concentration of about $5\times10^{14}$ to $1\times10^{15}$ ions/cm$^2$. Next, a first mask film pattern 510 such as a photoresist layer pattern is formed to subsequently expose the upper silicon layer 203 of the second region PMOS and cover the first region NMOS.

Figure 8:
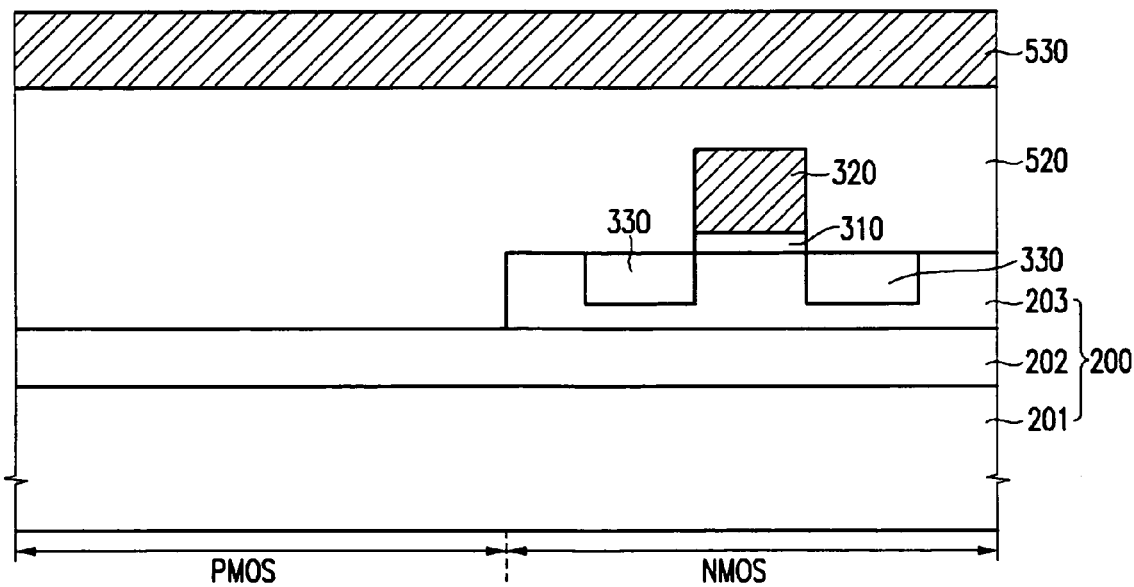

Referring to FIG. 8, the upper silicon layer 203 exposed in the second region PMOS is removed by using the first mask film pattern 510 (see FIG. 7) as an etching mask. As a result of the etching process, the upper silicon layer 203 exists on only the first region NMOS. After the upper silicon layer 203 of the second region PMOS is removed, the first mask film pattern 510 (see FIG. 7) is removed. Next, a first insulating layer 520 is formed on the entire surfaces of the first region NMOS and the second region PMOS. The first insulating layer 520 covers the upper silicon layer 203 and the first gate conductive layer pattern 320 of the first region NMOS and the insulating layer 202 exposed in the second region PMOS. Here, the first insulating layer 520 is a low temperature oxide (LTO) layer having a thickness of 1000 to 5000 Å. After the low temperature oxide layer is formed, a top surface of the low temperature layer is planarized by performing a planarization process such as a CMP (chemical mechanical polishing) process. Next, a second insulating layer 530 is formed on the first insulating layer 520. Like the first insulating layer 520, the second insulating layer 520 is a low temperature oxide layer having a thickness of about 1000 to 5000 Å.

Figure 9:
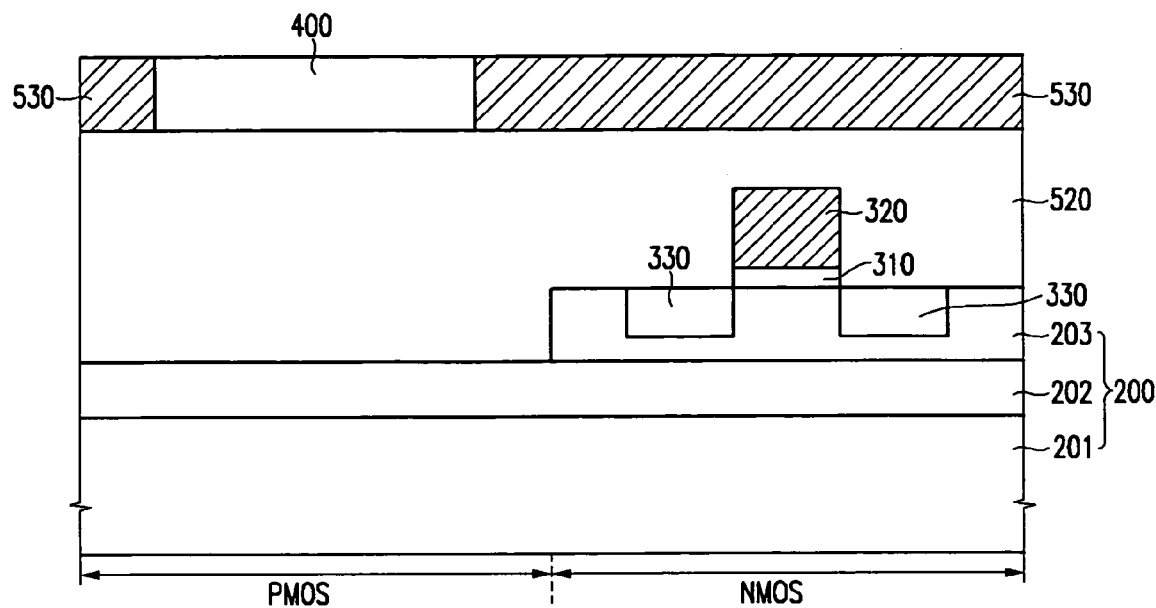

Referring to FIG. 9, a portion of a surface of the first insulating layer 520 in the second region PMOS is exposed by removing a portion of the second insulating layer 530. Next, a silicon epitaxial layer 400 is formed on the exposed surface of the first insulating layer 520. The silicon epitaxial layer 400 has a thickness of about 1000 to 5000 Å.

Figure 10:
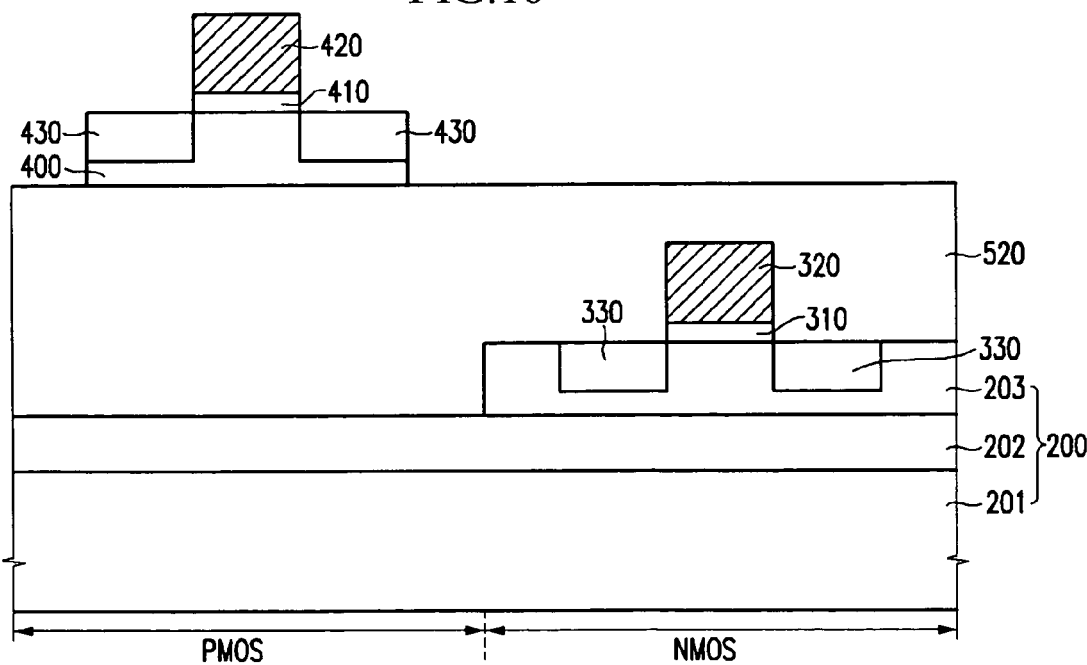

Referring to FIG. 10, the second insulating layer 530 is removed. Next, a second gate insulating layer pattern 410 and a second gate conductive layer pattern 420 are formed on the silicon epitaxial layer 400. The second gate insulating layer pattern 410 is an oxide layer having a thickness of about 10 to 50 Å; and the second gate conductive layer pattern 420 is a polysilicon layer having a thickness of about 500 to 2000 Å. Next, second source/drain regions 430 are formed on the silicon epitaxial layer 400 by performing a second ion implanting process. The second ion implanting process is performed by implanting boron (B) ions with an implanting energy of about 2 to 50 keV and a concentration of about $5\times10^{14}$ to $5\times10^{15}$ ions/cm$^2$.

Figure 11:
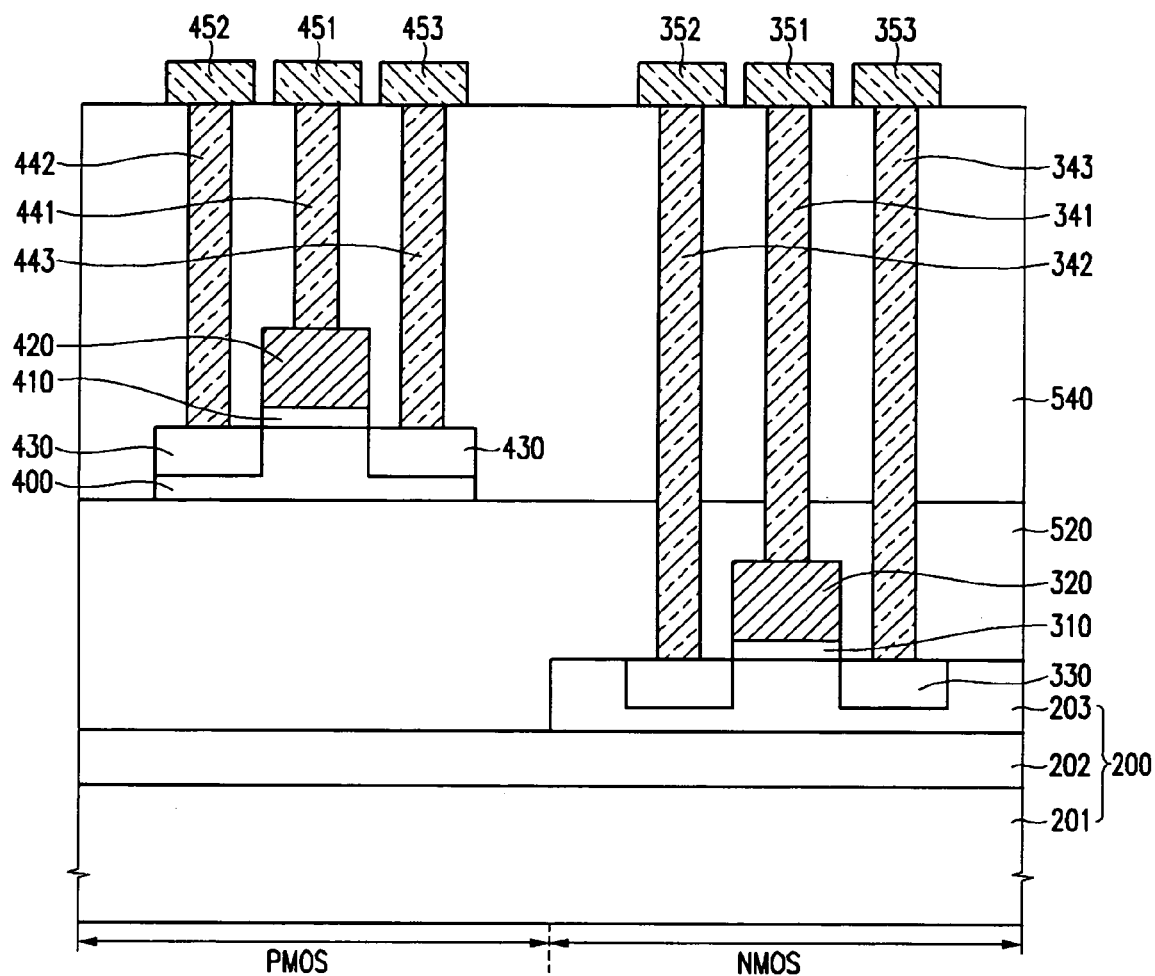

Referring to FIG. 11, a third insulating layer 540 is formed on the entire surface of the resultant structure. Like the first insulating layer 520, the third insulating layer 540 is a low temperature oxide layer having a thickness of about 1000 to 5000 Å. After the low temperature oxide layer is formed, a top surface of the low temperature layer is planarized by performing a planarization process such as a CMP (chemical mechanical polishing) process. Next, an RTP (rapid thermal processing) process is performed at a temperature of about 900 to 1100° C. in N$_2$ ambience for 10 to 30 seconds. Next, first contact plugs 341, 342, and 343 passing through the first insulating layer 540 in the first region NMOS are formed to be in a contact with the first gate conductive layer pattern 320 and the first source/drain regions 330. In addition, second contact plugs 441, 442, and 443 passing through the first insulating layer 540 in the second region PMOS are formed to be in a contact with the second gate conductive layer pattern 420 and the second source/drain regions 430. Next, first metallization layers 351, 352, and 353 are formed to be in contact with the respective second contact plugs 341, 342, and 343; and second metallization layers 451, 452, and 453 are formed to be in contact with the respective second contact plugs 441, 442, and 443.

As described above, according to a method of manufacturing a CMOS transistor of the present invention, n-channel and p-channel MOS transistors having a vertical step difference are formed as a multi-layered structure by using an SOI substrate, so that it is possible to increase integration degree.

The present application contains subject matter to that disclosed in Korean patent Application No. 10-2003-0098382, filed on Dec. 27, 2003, the entire contents of which is incorporated herein by reference.

While the present invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing a CMOS transistor, comprising steps of:

preparing a SOI substrate having
an insulating layer between lower and upper silicon layers,
a first region where an n-channel MOS transistor is to be formed, and
a second region where a p-channel MOS transistor is to be formed;
subsequently forming a first gate insulating layer pattern and a first gate conductive layer pattern on the upper silicon layer of the first region in the SOI substrate;
forming a first source/drain region on the upper silicon layer of the first region by performing a first ion implanting process;

removing the upper silicon layer of the second region, including using a mask film pattern for covering the first region as an etching mask;

forming a first insulating layer on the upper silicon layer and the first gate conductive layer pattern of the first region and the insulating layer exposed in the second region;

forming a second insulating layer on the first insulating layer;

exposing a portion of a surface of the first insulating layer in the second region by removing a portion of the second insulating layer;

forming a silicon epitaxial layer on the surface of the first insulating layer exposed in said exposing step and removing the second insulating layer;

forming a second gate insulating layer pattern and a second gate conductive layer pattern on the silicon epitaxial layer; and forming second source/drain regions on the silicon epitaxial layer by performing a second ion implanting process.

2. The method of claim 1, wherein the step of forming a first insulating layer includes forming a low temperature oxide layer having a thickness in an inclusive range of 1000 through 5000 Å.

3. The method of claim 2, wherein, after the low temperature oxide layer is formed, a top surface of the low temperature layer is planarized by performing a planarization process.

4. The method of claim 1, wherein the step of forming the silicon epitaxial layer includes forming the silicon epitaxial layer to have a thickness of 1000 through 5000 Å.

5. The method of claim 1, wherein the step of forming the second insulating layer includes forming a low temperature oxide layer having a thickness in an inclusive range of 1000 through 5000 Å.

6. The method of claim 1, wherein the first ion implanting process is performed by implanting arsenic (As) ions with an implanting energy of about 5 to 50 keV and a concentration of about $5 \times 10^{14}$ to $1 \times 10^{15}$ ions/cm$^2$.

7. The method of claim 1, wherein the second ion implanting process is performed by implanting boron (B) ions with an implanting energy of about 2 to 50 keV and a concentration of about $5 \times 10^{14}$ to $5 \times 10^{15}$ ions/cm$^2$.

8. A method of manufacturing a CMOS transistor comprises steps for:

preparing a SOI substrate having
an insulating layer between lower and upper silicon layers,
a first region where an n-channel MOS transistor is to be formed, and
a second region where a p-channel MOS transistor is to be formed;

subsequently forming a first gate insulating layer pattern and a first gate conductive layer pattern on the upper silicon layer of the first region in the SOI substrate;

forming a first source/drain region on the upper silicon layer of the first region by performing a first ion implanting process;

removing the upper silicon layer of the second region, including using a mask film pattern for covering the first region as an etching mask;

forming a first insulating layer on the upper silicon layer and the first gate conductive layer pattern of the first region and the insulating layer exposed in the second region;

forming a second insulating layer on the first insulating layer;

exposing a portion of a surface of the first insulating layer in the second region by removing a portion of the second insulating layer;

forming a silicon epitaxial layer on the surface of the first insulating layer exposed in said exposing step and removing the second insulating layer;

forming a second gate insulating layer pattern and a second gate conductive layer pattern on the silicon epitaxial layer; and forming second source/drain regions on the silicon epitaxial layer by performing a second ion implanting process.

* * * * *